Jan. 1, 1952

D. B. POST

MULTISTAGE VARIABLE-SATURATION TUNING SYSTEM AND APPARATUS

Filed Nov. 25, 1949

2,581,202

Inventor
DONALD B. POST
By H. W. Newton
Attorney

Patented Jan. 1, 1952

2,581,202

UNITED STATES PATENT OFFICE 2,581,202

MULTISTAGE VARIABLE-SATURATION TUNING SYSTEM AND APPARATUS

Donald B. Post, Collingswood, N. J., assignor to Radio Corporation of America, a corporation of Delaware Application November 25, 1949, Serial No. 129,352

18 Claims. (Cl. 250—40)

Figures 1, 2, 3, 4, 5:
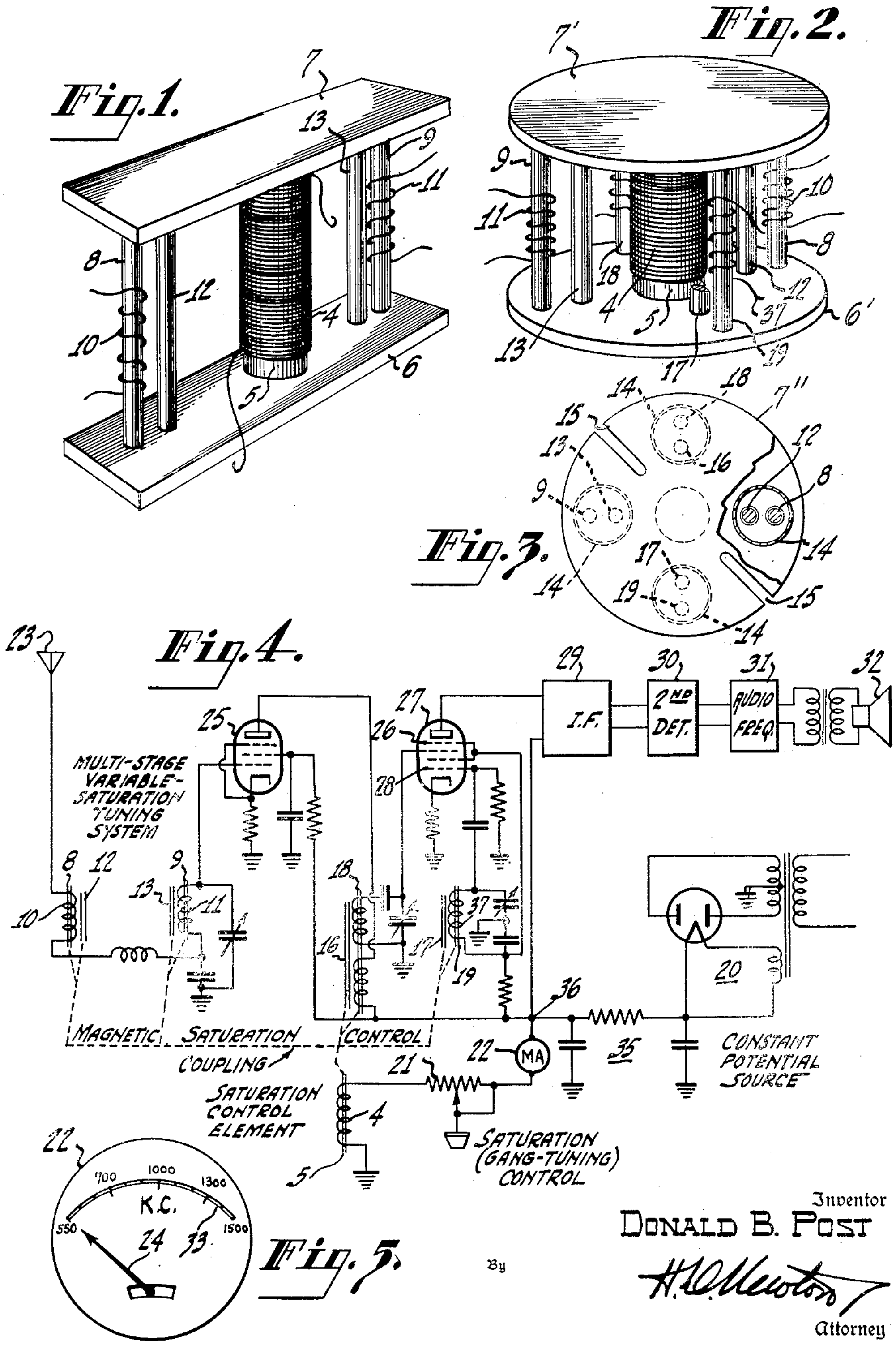

This invention relates to ganged saturation tuning systems and apparatus for variably controlling in unison the tuning or frequency response of a plurality of electrical circuits, such as the signal input circuits of a radio receiving system, for example.

More particularly, this invention relates to multi-stage variable-saturation tuning systems for high frequency signal circuits and the like, wherein several tuned circuits are conjointly or simultaneously controlled by saturation elements which serve to vary the flux density in the fields of inductance elements of the several tuned circuits.

Saturable core reactor control of tuned circuits is well known and has been extensively used for tuning radio circuits. In many cases such units in the prior art have been ganged together, but there appears to be no completely satisfactory saturation tuning system having several circuits all of which may be tuned by single control means, because, among other things, of difficulties encountered in maintaining a desired frequency relation between the several tuned circuits involved.

One example of a prior art ganged tuner system employing saturable core reactors, of the type to which the present invention relates generally, is that disclosed in the U. S. Patent 2,159,754, to O. Wohlfarth, wherein a plurality of saturating cores are used to tune separate circuits and a single control is used to regulate saturating current flowing to several separate tuning core sections. In this type of ganged tuning it is difficult to keep the separate circuits from interacting because of stray inductive coupling and because control current flow must be maintained in balance between the cores in a predetermined manner in each case. In these tuners, therefore, any change of impedance in one tuning section will result in a change of magnetic flux which will produce a change of impedance for the direct current and disturb equilibrium attained in the section and in the entire system. This results in unbalance of the current flowing in each of the separate tuning coils and, therefore, effectively modulates the system with an unwanted change in tuning characteristics. An additional objection to this type of ganged tuning is that a high value of current is needed to operate the several cores thus making it impractical to associate ganged core tuning with a commercial receiver having a limited amount of current available in the power supply.

If, in accordance with the prior art, a single saturating core is associated with the separate windings, it is possible to cut down the total current requisites of the saturating coil to a practicably usable value yet the single coil affords a good coupling path between the respective circuits. In addition the modulating effect mentioned heretofore is also present though in a smaller degree. Not only does the single coupling path provided by the saturating core give a low "Q" circuit (where "Q" is the ratio of inductive reactance to resistance) because of the lowered overall inductance due to a high reluctance R.-F. magnetic path through the saturating core but it allows the respective circuits to interact through this common coupling path. A further objection to this type of circuit is that the "Q" is dependent upon the amount of flux in the saturating core, and is therefore varied with a change in frequency.

These hereinbefore mentioned difficulties found in ganged tuning circuits of the saturable core reactor type have made such devices impractical for application in commercial type equipment.

It is, therefore, a primary object of this invention to correct the inadequacies of the prior art and provide an improved saturable core reactor which may be used for ganged tuning.

Another object of this invention is to provide an improved saturable core reactor having a high "Q."

A further object of the invention is to provide a saturation tuning system wherein means are provided in tuning elements of the system for decoupling high frequency tuned circuit portions from the direct current saturating circuit portions.

A still further object of the invention is to provide a multistage tuning system having a plurality of saturably tuned circuits embodying a single saturating flux source.

In one embodiment of the invention, therefore, there is provided a saturable core reactor consisting of a single electromagnetic-coil structure, having a core of high permeability and low retentivity material used as a saturating means, in combination with a plurality of tunable windings for high frequency signals having high permeability saturable cores at present preferably being made of ferrite or like materials. A closed magnetic path of low reluctance material is provided from the saturating solenoid through the tunable windings. Tuning of the R.-F. circuits simultaneously is accomplished by saturating the cores of the various tuning inductances with magnetic flux provided by direct current flowing in a single saturating electro-magnet circuit of low reluctance is associated with each of the respective tunable windings, in this embodiment comprising rods of high permeability material, thus affording a very high permeability shunt circuit for magneto-motive forces at radio frequencies when compared with the permeability of the saturating core, which is decreased by the effect of high inductance D.-C. electromagnetic coil, and thereby to provide effective decoupling of the R.-F. circuits from the D.-C. coil.

The above and further objects and features of this invention will be better understood in the following detailed description, when taken in connection with the accompanying drawing in which similar reference characters denote similar elements in the respective views and in which:

Figure 1 is a view in perspective, of tuning apparatus representing one specific embodiment of the invention, Figure 2 is a similar view in perspective of further tuning apparatus, being a modified form of the invention shown in Figure 1, Figure 3 is a plan view of the apparatus shown in Figure 2, partly broken away to show a lower portion, and illustrating a further detailed modification of the invention, Figure 4 is a schematic circuit diagram of a signal receiver provided with a tuning system embodying the invention and utilizing apparatus of the type shown in Figure 2, and Figure 5 is a front view of a calibrated scale and pointer for a tuning meter as shown in Figure 4.

Referring more particularly to Figure 1, there is shown a means which may be used for tuning two circuits by the magnetic principle with a single D.-C. saturating coil 4. The saturating core 5 and its associated bottom and top frame members 6 and 7, extending outward from the core to form a rectangular section in this structure, are made of high permeability, low retentivity material such as hydrogen annealed mu metal, or one of the high permeability ferrites. A D.-C. saturating coil winding 4 is placed on the center core member 5 to provide a means for generating a saturation field. The coil may have a number of turns depending upon the current and voltage available and the core 5 may have a size depending upon the relative permeabilities of itself and the cores 8, 9 for the tunable circuits which will be associated therewith. The cores 8 and 9 of these tunable circuits are made of a saturable magnetic material such as a higher permeability ferrite and are inserted between the ends of the rectangular members 6, 7, closing the gap between the top and bottom frame members thus providing a complete low reluctance magnetic path for the saturating field through the saturable cores in the tunable circuits.

Tunable windings 10, 11, which are placed upon the corresponding saturable cores 8, 9, may be associated with any desirable tuned circuits as for example the R.-F. and oscillator circuits of a radio receiver system. Additional elements 12, 13 similar to the saturable tuning cores are located in close physical proximity to the respective tuning cores 8, 9 thus providing a low reluctance closed path in shunt with that of the saturation core 5 through which magnetic flux at radio frequencies may be bypassed thus decoupling flux variations of one tunable core from another tunable core and from the saturating core. In the shown embodiment these decoupling elements 12, 13 are physically interspersed between the saturation core 5 and the tuning cores 8, 9 to provide a more complete shielding effect for magnetic flux variations.

In operation a direct current in the saturating coil 4 will cause a magnetic flux to appear in the series magnetic circuit through saturating core 5, the rectangular frame members 6 and 7 and the shunted saturable tuning cores 8, 9 and de-coupling elements 12, 13. The tunable circuit cores 8, 9 are selected of a saturable material as described above and, therefore, the inductance of the windings 10, 11 may be altered by the change of permeability in the tuning cores 8 and 9 which in turn is caused by a change in the D.-C. magnetic field in the saturating coil 4. Different tuned circuit core diameters may be selected to change the ratio of inductance change in the tunable windings 10, 11 with the change in D.-C. magnetic field strength, and to achieve tracking of the separate tuned circuits associated with these windings which might be for example the R.-F. circuit and the oscillator circuit of a radio receiver system.

De-coupling elements 12, 13, which are associated in close physical proximity with the respective tuning coils 8, 9, provide a low reluctance closed magnetic path for the R.-F. magnetic field set up in the tuning cores. Since the D.-C. winding 4 generally has many turns and accordingly a large inductance it has a high reluctance to radio frequency flux compared to that of the de-coupling elements 12, 13 and therefore an R.-F. magnetic field will find the de-coupling elements a comparative short circuit path. In this manner a very satisfactory de-coupling of the R.-F. field will result. The reluctance of the R.-F. path provided through the de-coupling element is low compared to that of the R.-F. path provided through the D.-C. saturating core. It is therefore seen that the R.-F. inductive reactance will increase when using this structure because of the lower reluctance path and thereby the tuned circuit "Q" will be well up in a usable range because the resistance of the circuit remains essentially constant.

Should a change of flux density be effected in one of the tuned circuits of this structure, the resulting change of magnetic field would essentially be short-circuited through the low reluctance de-coupling element rather than the D.-C. solenoid core, through which flux changes would have to pass in prior art structures not using the de-coupling element. The objectionable modulation effect common in these circuits of the prior art is thereby eliminated since a change of impedance in one of the circuits and the corresponding change of flux in one core will not appreciably disturb the flux density in any of the adjacent cores.

There is, therefore, provided a structure which may be used for ganged permeability tuning of R.-F. circuits wherein the tuned circuit "Q" is high, the inter-coupling between the separate tuned circuits is essentially eliminated and the D.-C. current requirements may be kept at a low value.

The embodiment shown in Figure 2 is an elevation view of a similarly constructed device with provisions for tuning four circuits simultaneously by the magnetic saturation principle. The principle of operation of this device is identical with the structure shown in Figure 1, although the frame members 6′ and 7′ are of circular disk construction rather than rectangular, and four tunable circuit windings along with their associated saturable cores are arranged radially about the single central saturating core 5.

Figure 3 is a plan view of Figure 2 in which an additional feature comprising electrostatic shield cans 14 around the respective tuning sections is provided. These shield cans may be constructed of aluminum or like material and they provide electrostatic shielding between the adjacent tuning inductance windings. The shield cans may also be constructed of a low resistance, high permeability ferrite, thus providing both electrostatic shielding and magnetic decoupling with the same element. Of course, in such a structure the additional de-coupling elements 12 and 13 would be unnecessary.

Radially cut slots 15 may also be provided, as shown in the modified frame member 7″, between any adjacent tuning sections such as shown to further eliminate any tendency for R.-F. coupling between adjacent sections directly through the frame members. These slots provide a high reluctance air gap in the direction of the adjacent tuning section thus forcing any magnetic flux tending to provide coupling directly between the tuning circuits to take a tortuous path through the low reluctance frame member. The latter path in the frame member is paralleled by the shorter path through the decoupling rod and therefore the flux is directed through this shorter path. As the spacing between the respective tuning sections decreases the need for such additional structural limitation increases. The distance in the frame member structure between a tuning core 9 and its respective decoupling element 13 should be small compared with the distance to the adjacent tuning core for best results. It is to be recognized, however, that the reluctance of the magnetic path through an adjacent tuning coil is still relatively high compared to that of the path through the decoupling element because of the associated inductance winding which will cause a higher R.-F. reluctance in the core. This effect is even more pronounced at higher frequencies where a small amount of inductance has a very high impedance.

In Figure 4 there is shown a magnetic tuning structure, as described heretofore, cooperating in combination with a receiver circuit in which four tuned circuits employ respectively saturable core inductive reactors. These saturably tuned reactors are shown in the antenna coupling circuit, the R.-F. input circuit, the mixer input circuit and the oscillator circuit and thus are permeability tuned by means of magnetic saturation control coupling (shown in the drawing by dotted lines) emanating from a single magnetic flux source.

A tuning control instrumentality as shown in Figure 2 may be used in the subject receiver circuit as for example the tunable winding 10 is employed as a tuned antenna coupling circuit winding connected to an antenna 23. The saturable core 8 of the winding 10 is magnetically coupled to a saturation control element 5 and the decoupling element 12 is physically located near the saturable core 8 as shown. In a similar manner the other elements of the tuner shown in Figure 2 are connected in the R.-F. input circuit 9, 11, 13, the mixer circuit 16, 18 and the oscillator circuit 17, 19.

To prevent feed-back circuits or parasitic oscillations the respective circuits may easily be further isolated by means of air gaps 15 in the tuner frame members between adjacent tunable windings, as shown in Figure 3, as well as by means of physically locating cores of circuits which might tend to interact on opposite sides of the saturation element as for example the R.-F. cores 17, 19. Saturating flux is generated by a D.-C. winding 4 on the saturating core 5 and this winding is connected to the positive terminal 33 of a constant potential receiver power supply means 20, which has an adequate filter means 35. A series D.-C. energizing path is provided for the coil 4 through the variable tuning resistance 21, tuning meter 22, and power supply means 20. In this manner a small amount of current (in the order of a few milliamperes) from the constant potential source 20 may be utilized to tune the receiver, and frequency selection is made by means of the variable tuning resistance 21 which controls the amount of current flowing in the D.-C. saturating coil 4. As the current through this coil 4 changes, the inductance of the tuned circuits will simultaneously change as a function of the direct current flow in the D.-C. coil 4. Since this direct current also flows through the tuning meter 22 it can be calibrated in frequency as shown in Figure 5 and can therefore be used as a simplified tuning dial means.

In operation, the receiver has an R.-F. signal input to an antenna 23 and this signal is connected to an R.-F. input circuit which is tuned by the two saturable core inductors 10, 11. This R.-F. circuit is electrically coupled to the control electrode of an R.-F. amplifier tube 25 which amplifies the R.-F. signal. The amplified R.-F. signal is then coupled to a mixer tube 27 by means of an R.-F. transformer, the primary of which is connected to the positive terminal in the power supply thereby supplying anode voltage to the R.-F. tube. The R.-F. transformer, which has a saturable core 18 and a decoupling element 17, is coupled to one input electrode 26 of the electronic mixer tube 27 by a lead from the mid-connection of two capacitors shunting the transformer secondary thus inserting the R.-F. signal to the mixer. A Colpitts oscillator circuit, which has a tuned circuit comprising a saturable reactor 37 shunted by two series capacitors the mid-connection of which goes to the mixer cathode, has an output connection to a second input electrode 28 of the mixer. Heterodyned output signals from the mixer are then fed to an I.-F. amplifier 29, shown in block diagram in the drawing, which in turn is electrically connected to similar cascade coupled circuits such as a second detector 30, and an audio frequency amplifier 31, which is coupled by an audio output transformer to the speaker 32.

A saturating D.-C. winding 4 has its saturation core 5 magnetically coupled to all the saturable cores of the tuning reactors 8, 9, 18 and 19 contained in the described receiver circuits, as shown by the dotted lines in the drawing. Decoupling elements 12, 13, 16 and 17 isolate flux linkages in each of the particular circuits, and prevent interference in the manner heretofore described. The saturating solenoid is electrically connected to the constant potential source 20 at the positive terminal 36 through a series variable tuning resistor 21, which determines the amount of D.-C. flow in the solenoid, and a series tuning meter 22. Since the current requirements for the described embodiment of the invention are small, the constant potential source is the normal receiver power supply means which is also used to supply direct current to the necessary receiver elements including the I.-F. amplifier 29, second detector 30 and A.-F. amplifier 31.

A mechanical tuning dial arrangement is precluded in the receiver by the use of the invention which provides a ganged saturation tuning system with only one saturation coil 4. An ordinary milliammeter 22 may thus be employed as a tuning meter, and the dial face of this milliammeter 22 has a pointer 24 and a scale 33 calibrated in kilocycles as shown in Figure 5. Since the current flow in the saturating solenoid 5 is a function of the frequency of the tuned circuits the relationship may easily be shown on the meter face. In this arrangement the only moving parts provided in the entire tuning system are the meter movement and the potentiometer tuning control. Since these moving parts are in a D.-C. circuit, moving R.-F. elements are eliminated. A stable and simplified electrical tuning system is therefore provided which affords many advantages over prior art systems.

While it is to be recognized that there is hereinbefore fully disclosed the nature and operation of the invention, yet there will be certain modifications suggested by the disclosure to those skilled in the art which will not depart from the spirit of this present invention, and the invention is not to be limited to the particular design of either the tuner structures or the receiver circuit.

What is claimed is:

1. A multi-stage variable saturation tuning system comprising in combination: a constant potential power supply means; a plurality of permeability tunable circuit windings each having a saturable core; a magnetic element providing a closed low reluctance magnetic path with each of said saturable cores; a saturating inductor having a high permeability core element; frame members of high permeability material connecting said magnetic element with said saturable cores and completing a series magnetic path through the said inductor core and each of said saturable cores; a variable current regulating device; and electrical connections completing a series circuit including said inductor, said regulating device and said power supply means.

2. A tuning system as defined in claim 1, in which a current responsive tuning meter is inserted in series relationship with said series circuit.

3. A tuning system as defined in claim 1, wherein said frame members are of circular disk construction, wherein said core element is centrally located between said circular disks and wherein said saturable cores are radially distributed around said core element.

4. A tuning system as defined in claim 3, wherein a separate magnetic element is provided for each said saturable core and wherein said magnetic elements are physically interspersed between said core element and said saturable cores.

5. A saturable core tuner comprising in combination: a tunable circuit having an inductor and a saturable core therefore; a saturating flux source; a member of high permeability material completing a magnetic path of extended length between said saturable core and said flux source, and a high permeability decoupling element completing a shortened low reluctance path through said saturable core, whereby decoupling of the tunable circuits is effected.

6. A tuner as described in claim 5 in which said decoupling element is physcially interspersed between said saturable core and said high permeability core 7. A tuner as described in claim 5 in combination with electrostatic shields enveloping said tunable inductor and said decoupling element.

8. A tuner according to claim 5 in which said decoupling element has a low electrical resistance and concentrically envelops said saturable core thus functioning as an electrostatic shield.

9. A saturable core ganged tuner comprising in combination a plurality of tuning inductances each having a saturable core, a single saturating inductance having a high permeability core, frame members of high permeability material completing a magnetic path between said cores, and a magnetic decoupling element associated with each of said tuning inductances providing a complete low reluctance magnetic circuit exclusive of said path between said cores.

10. A tuner as described in claim 9 wherein said frame members are configurated to provide tortuous magnetic paths between adjacent saturable cores of said tuning inductances, thus further decreasing coupling between said adjacent cores by providing an extended length path between said saturable cores in said frame members, and wherein said decoupling elements are in close physical proximity with said saturable cores, thus providing a shunting magnetic path of shorter length.

11. A multi-stage variable saturation tuning system comprising in combination, a plurality of inductors having saturable cores each inductor being connected in a tuning stage of said system, a plurality of decoupling elements each providing a closed magnetic path with one of said cores, a saturation control element having a high permeability core for providing a saturating flux in said cores, and a magnetic saturation control coupling circuit for connecting said control element magnetically to said cores, whereby the tuning stages may be saturably controlled in unison.

12. A system as defined in claim 11 wherein said coupling circuit comprises two circular disc frame members having said control element axially mounted therebetween, and wherein said saturable cores are mounted therebetween and are radially positioned from said control element.

13. A system as defined in claim 12 wherein said decoupling elements are radially positioned between said control element and said saturable cores.

14. A system as defined in claim 12 wherein said saturable cores and said decoupling elements are both enveloped in a low resistance electrostatic shield.

15. A system as defined in claim 12 wherein low permeability portions are provided in said frame members between adjacent saturable cores, thus providing a tortuous path in high permeability portions of said frame members for flux linkages between said adjacent cores.

16. A tuning control instrumentality comprising a saturable core element for a tunable winding, a saturating control core for a saturation winding, high permeability frame members completing a magnetic path between said element and said control core, and a high permeability decoupling element completing a closed magnetic circuit through said frame members and said core element exclusive of any path through said control core, thereby effectively magnetically isolating each saturation core from said control core.

17. An instrumentality as defined in claim 16 wherein said decoupling element is physically interspersed between said saturable core element and said control core.

18. An instrumentality as defined in claim 16 wherein the magnetic path through said saturable core element and said control core is of higher reluctance than the magnetic path through said saturable core element and said decoupling element.

DONALD B. POST.

REFERENCES CITED

The following references are of record in the file of this patent:

UNITED STATES PATENTS

| Number | Name | Date |
|---|---|---|
| 2,202,840 | De Kramolin | June 4, 1940 |